(12) United States Patent
Zhang et al.

(10) Patent No.: US 10,788,863 B1
(45) Date of Patent: Sep. 29, 2020

(54) FLEXIBLE DISPLAY DEVICE (71) Applicant: WUHAN CHINA STAR OPTOELECTRONICS SEMICONDUCTOR DISPLAY TECHNOLOGY CO., LTD., Wuhan, Hubei (CN)

(72) Inventors: Zhuo Zhang, Hubei (CN); Wen Han, Hubei (CN); Fang Wang, Hubei (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/609,501

(22) PCT Filed: May 8, 2019

(86) PCT No.: PCT/CN2019/085964
§ 371 (c)(1),
(2) Date: Oct. 30, 2019

(30) Foreign Application Priority Data

Apr. 16, 2019 (CN) .......................... 2019 1 0305879

(51) Int. Cl.
*G06F 1/16* (2006.01)
*G06F 1/26* (2006.01)

(52) U.S. Cl.
CPC .......... *G06F 1/1652* (2013.01); *G06F 1/1624* (2013.01); *G06F 1/26* (2013.01)

(58) Field of Classification Search
CPC ....... G06F 1/1624; G06F 1/1652; G09F 9/301
USPC ....................................... 361/679.02, 679.21
See application file for complete search history.

(56) References Cited

U.S. PATENT DOCUMENTS

| 5,469,020 A * | 11/1995 | Herrick ................. G02F 1/1365 257/E25.02 |
| 7,158,111 B1 * | 1/2007 | Jackson .................. G02F 1/091 345/107 |
| 2016/0187929 A1 * | 6/2016 | Kim ...................... G06F 1/1601 345/184 |
| 2017/0196102 A1 * | 7/2017 | Shin ...................... H05K 5/0017 |
| 2019/0204874 A1 * | 7/2019 | Kim ...................... G06F 1/1643 |
| 2019/0211234 A1 * | 7/2019 | Yamasaki .......... G02F 1/133305 |
| 2019/0212780 A1 * | 7/2019 | Choi ................... H01L 27/3246 |

* cited by examiner

*Primary Examiner* — Anthony Q Edwards
(74) *Attorney, Agent, or Firm* — Mark M. Friedman (57) ABSTRACT

A flexible display device is provided. The flexible display device includes a housing assembly, and a flexible display screen located in the housing assembly. The flexible display screen includes a backplate layer, a display panel located on the backplate layer, and a cover-plate layer located on the display panel. When the flexible display screen is curled, the backplate forms a first curling portion, the display panel forms a second curling portion, and the cover-plate layer forms a third curling portion. The first curling portion and the third curling portion are located inside the second curling portion.

18 Claims, 4 Drawing Sheets

FLEXIBLE DISPLAY DEVICE

FIELD OF INVENTION

The present invention relates to a field of display technologies, and more particularly, to a flexible display device.

BACKGROUND OF INVENTION

With the development of technology, the appearance of mobile electronic devices has tremendous changes. Flexible screens have attracted much attention due to their unique characteristics and huge potential. Compared with traditional screens, flexible screens have stronger flexibility and well bendable characteristic, which can reduce the degree of accidental damage to the equipment, and flexible screens are more durable than other screens.

Current flexible screens include foldable display screens and rollable display screens, the above two types of display screens may reduce the size of panel with a certain degree, but they still occupy a large space.

Therefore, it is necessary to provide a flexible display device to solve the problems of the prior art.

SUMMARY OF INVENTION

The present application provides a flexible display device to solve the technical problem that existing flexible screens occupy a large space.

In order to solve the aforementioned problem, the technical solution provided by the present application as follow:

The present application provides a flexible display device, including a housing assembly, and a flexible display screen located in the housing assembly;

wherein the flexible display screen includes a backplate layer, a display panel located on the backplate layer, and a cover-plate layer located on the display panel;

when the flexible display screen is curled, the backplate layer forms a first curling portion, the display panel forms a second curling portion, and the cover-plate layer forms a third curling portion;

a curling direction of the first curling portion is different from a curling direction of the third curling portion, a curling direction of the second curling portion is same as the curling direction of the first curling portion or of the third curling portion, wherein the first curling portion and the third curling portion are located inside the second curling portion.

In the flexible display device of the present application, a circumscribed circle diameter of the second curling portion is equal to the sum of a circumscribed circle diameter of the first curling portion and a circumscribed circle diameter of the third curling portion.

In the flexible display device of the present application, the circumscribed circle diameter of the first curling portion is equal to the circumscribed circle diameter of the third curling portion.

In the flexible display device of the present application, the backplate layer is curled in the clockwise direction or the counterclockwise direction to form the first curling portion;

the cover-plate layer is curled in the clockwise direction or the counterclockwise direction, being different from the curling direction of the backplate layer, to form the third curling portion;

the display panel is curled in the clockwise direction or the counterclockwise direction to form the third curling portion.

In the flexible display device of the present application, the flexible display screen further includes a first bonding layer located between the backplate layer and the display panel, and a second bonding layer located between the display panel and the cover-plate layer;

when the flexible display screen is curled, the first bonding layer is separated from the backplate layer, the second bonding layer is separated from the cover-plate layer, and the first bonding layer, the second bonding layer, and the display panel are curled in the clockwise direction or the counterclockwise direction to form the second curling portion.

In the flexible display device of the present application, the flexible display screen further includes a third bonding layer located between the backplate layer and the first bonding layer, and a fourth bonding layer located between the cover-plate layer and the second bonding layer;

when the flexible display screen is curled, the third bonding layer is separated from the first bonding layer, the second bonding layer is separated from the fourth bonding layer;

the backplate layer and the third bonding layer are curled in the clockwise direction or the counterclockwise direction to form the first curling portion;

the cover-plate layer and the fourth bonding layer are curled in the clockwise direction or the counterclockwise direction, being different from the curling direction of the backplate layer and the third bonding layer, to form the third curling portion.

In the flexible display device of the present application, the flexible display screen further includes a fixed portion;

one end of the backplate layer, of the display panel, and of the cover-plate layer connect with the fixed portion;

when the flexible display screen is curled, the backplate layer, the display panel, and the cover-plate layer are curled from another end away from the fixed portion toward the fixed portion.

In the flexible display device of the present application, a processor, a driving chip, and an external port are disposed in the fixed portion.

In the flexible display device of the present application, the flexible display screen further includes a sliding portion;

the sliding portion disposed in parallel with the fixed portion;

when the flexible display screen is curled, the sliding portion slides from the end away from the fixed portion toward the fixed portion, and the backplate layer, the display panel, and the cover-plate layer are curled from the end away from the fixed portion toward the fixed portion;

when the flexible display screen is expanded, the sliding portion slides from the fixed portion toward the end away from the fixed portion, and the first curling portion, the second curling portion, and the third curling portion are expended to correspondingly form the backplate layer, the display panel, and the cover-plate layer.

In the flexible display device of the present application, the sliding portion includes a hollow area;

the sliding portion slides between the fixed portion and one end, away from the fixed portion, of the flexible display screen through the hollow area.

In the flexible display device of the present application, the flexible display screen further includes an engaging area;

the engaging area is located at an edge area of the flexible display screen;

wherein an engaging assembly is disposed in the engaging area.

In the flexible display device of the present application, the engaging assembly includes at least one first protrusion located at one side, adjacent to the backplate layer, of the display panel, at least one second protrusion located at one side, adjacent to the cover-plate layer, of the display panel, at least one first groove located at one side, adjacent to the display panel, of the backplate layer, and at least one second groove located at one side, adjacent to the display panel, of the cover-plate layer;

when the flexible display screen is expanded, the sliding portion slides from the fixed portion toward one end, away from the fixed portion, of the flexible display screen, the sliding portion realizes the engagement of the first protrusion of the display panel and the first groove of the backplate layer, and the engagement of the second protrusion of the display panel and the second groove of the cover-plate layer;

when the flexible display screen is curled, the sliding portion slides from the end, away from the fixed portion, of the flexible display screen toward the fixed portion, the first protrusion of the display panel is separated from the first groove of the backplate layer, and the second protrusion of the display panel is separated from the second groove of the cover-plate layer.

In the flexible display device of the present application, the flexible display screen further includes a touch layer; the touch layer located on the display panel or the cover-plate layer.

In the flexible display device of the present application, the housing assembly further includes a first housing; when the flexible display screen is curled, the first curling portion, the second curling portion, and the third curling portion are located in the first housing.

In the flexible display device of the present application, a first opening is disposed on one end of the first housing; when the flexible display screen is curled, the first curling portion, the second curling portion, and the third curling portion enter the first housing via the first opening.

In the flexible display device of the present application, an inscribed circle diameter of the first housing is greater than a circumscribed circle diameter of the second curling portion.

In the flexible display device of the present application, the housing assembly further includes a second housing; a second opening is disposed on one end of the second housing; and the first housing enters the second housing via the second opening.

In the flexible display device of the present application, a power supply assembly is disposed in the first housing or in the second housing.

The beneficial effect: the present application curls the flexible display screen by dividing the flexible display screen into three portions, wherein the curling direction of the first curling portion and of the third curling portion are opposite, and the second curling portion can wrap the first curling portion and the third curling portion. The flexible display screen is curled into a cylinder, such that the volume of the flexible display screen can be reduced and the flexible display screen can convenient to carry.

DESCRIPTION OF DRAWINGS

In order to more clearly illustrate the technical solutions in the embodiments or the prior art, the following drawings, which are intended to be used in the description of the embodiments or the prior art, will be briefly described. It will be apparent that the drawings and the following description are only some embodiments of the present invention. Those of ordinary skill in the art may, without creative efforts, derive other drawings from these drawings.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting. Throughout this specification and in the drawings like parts will be referred to by the same reference numerals.

Figure 1:
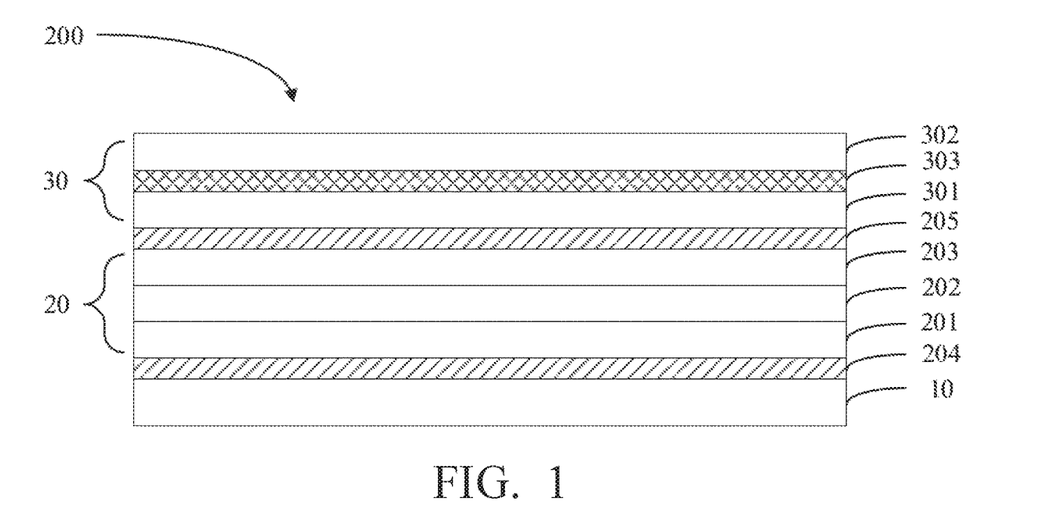
FIG. 1 is a structural diagram of a first type film layer structure of a flexible display screen of the present application.

Please refer to FIG. 1, FIG. 1 is a structural diagram of a first type film layer structure of a flexible display screen of the present application.

The flexible display device includes 100 a housing assembly 80, and a flexible display screen 300 located in the housing assembly 80.

The flexible display screen 300 includes a backplate layer 10, a display panel 20 located on the backplate layer 10, and a cover-plate layer 30 located on the display panel 20.

In the present embodiment, the backplate layer 10 is made of a corresponding flexible material that is resistant to bending, and the backplate layer 10 can be curled into any shape.

The display panel 20 is a flexible display panel 20. The display panel 20 may be a liquid crystal display (LCD) panel 20 or an organic light emitting diode (OLED) display panel 20. Similar to the backplate layer 10, the display panel 20 can be curled into any shape.

In the present embodiment, the OLED display panel 20 is taken as an example for description.

This display panel 20 may include an array substrate 201, a light-emitting device layer 202 located on the array substrate 201, and an encapsulation layer 203 located on the light-emitting device layer 202.

The cover-plate layer 30 may include a polarizer 301 located on the display panel 20, a cover plate 302 located on the polarizer 301, and an optical adhesive layer 303 located between the cover plate 302 and the polarizer 301. The polarizer 301, the optical adhesive layer 303, and the cover plate 302 are made of corresponding flexible materials that are resistant to bending, such that the cover-plate layer 30 can be curled into any shape.

In the present embodiment, the flexible display screen 300 further include a touch layer.

The touch layer may be located on the encapsulation layer of the display panel 20, or in the display panel 20, or in the cover-plate layer 30. There is no restriction for the specific location of the touch layer in the present application.

Figure 2:
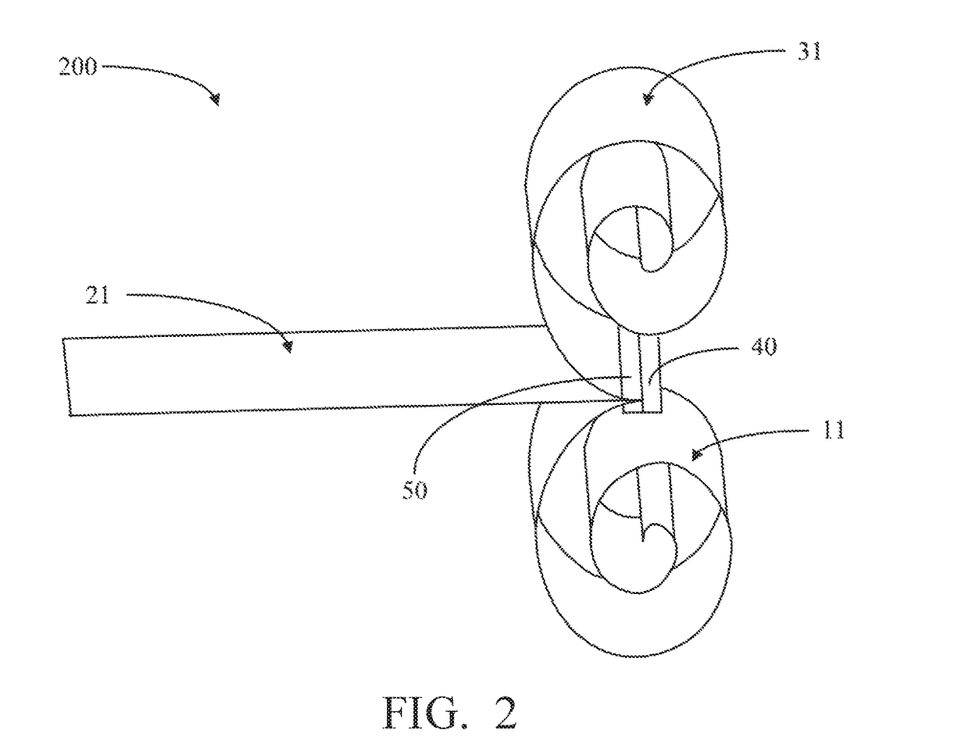
FIG. 2 is a structural diagram showing a first curling type of the flexible display screen of the present application.

Please refer to FIG. 2, FIG. 2 is a structural diagram showing a first curling type of the flexible display screen of the present application.

Figure 3:
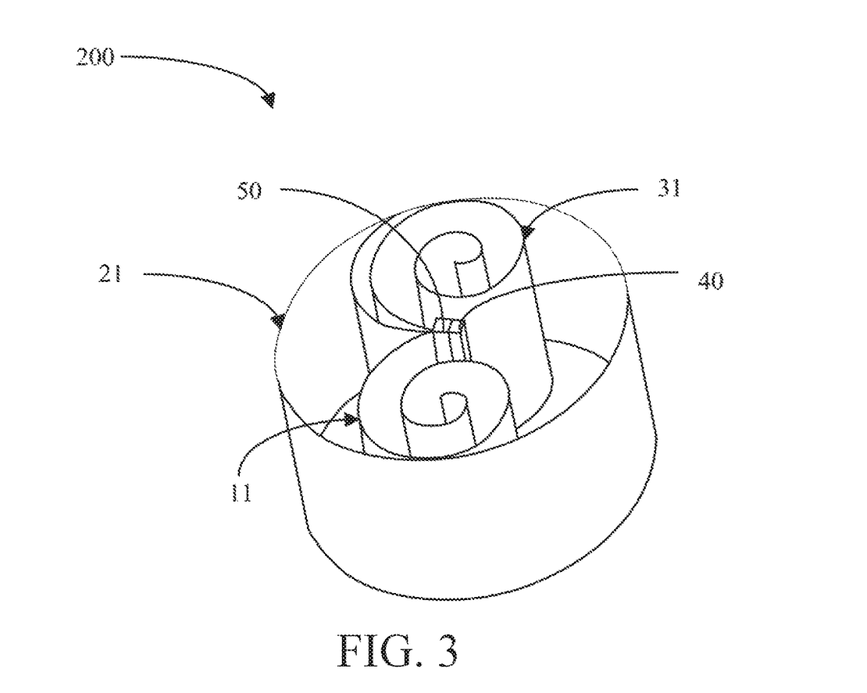
FIG. 3 is a structural diagram showing a second curling type of the flexible display screen of the present application.

Please refer to FIG. 3, FIG. 3 is a structural diagram showing a second curling type of the flexible display screen of the present application.

When the flexible display screen 300 is curled, the backplate layer 10 forms a first curling portion 11, the display panel 20 forms a second curling portion 21, and the cover-plate layer 30 forms a third curling portion 31.

A curling direction of the first curling portion 11 is different from a curling direction of the third curling portion 31, a curling direction of the second curling portion 21 is same as the curling direction of the first curling portion 11 or the curling direction of the third curling portion 31.

In the present embodiment, the first curling portion 11 and the third curling portion 31 are located inside the second curling portion 21.

The backplate layer 10 is curled in the clockwise direction or the counterclockwise direction to form the first curling portion 11. The cover-plate layer 30 is curled in the clockwise direction or the counterclockwise direction, being different from the curling direction of the backplate layer 10, to form the third curling portion. The display panel 20 is curled in the clockwise direction or the counterclockwise direction to form the third curling portion 31.

In the present embodiment, the backplate layer 10 is curled in the counterclockwise direction to form the first curling portion 11, the cover-plate 30 is curled in the clockwise direction to from the third curling portion 31, and the display panel 20 is curled in counterclockwise direction to form the third curling portion 31.

In the above film layers, the curling portion curled in a smaller radius bears greater stress. The display panel 20 has more film layers, which results in the stress that the display panel 20 can bear is smaller the stress that the backplate layer 20 and the cover-plate layer 30 can bear. Therefore, the display panel 20 is curled at last in the present application. The first curling portion 11 and the third curling portion 31 are formed before the second curling portion 21, and there is no restriction for the forming order of the above two curling portions in the present application.

In the present embodiment, a circumscribed circle diameter of the second curling portion 21 is greater than a circumscribed circle diameter of the first curling portion 11, and the circumscribed circle diameter of the second curling portion 21 is greater than a circumscribed circle diameter of the third curling portion 31.

In the present embodiment, the circumscribed circle diameter of the second curling portion 21 is equal to the sum of the circumscribed circle diameter of the first curling portion 11 and the circumscribed circle diameter of the third curling portion 31.

In the present embodiment, when a thickness of the backplate layer 10 is equal to a thickness of the cover-plate layer 30, the circumscribed circle diameter of the first curling portion 11 is equal to the circumscribed circle diameter of the third curling portion 31.

Please refer to FIG. 1, the flexible display screen 300 further includes a first bonding layer 204 located between the backplate layer 10 and the display panel 20, and a second bonding layer 205 located between the display panel 2 and the cover-plate layer 30.

The bonding layers are made of a material having a certain adhesion.

In the present embodiment, the thickness of the first bonding layer 204, and of the second bonding layer 205 are 50 microns.

When the flexible display screen 300 is expanded, the backplate layer 10 is combined with the display panel 20 by the first bonding layer 204, and the display panel 20 is combined with the cover-plate layer 30 by the second bonding layer.

When the flexible display screen 300 is curled, the first bonding layer 204 is separated from the backplate layer 10, the second bonding layer 205 is separated from the cover-plate layer 30, the first bonding layer 204, the second bonding layer 205, and the display panel 20 are curled in the clockwise direction or the counterclockwise direction to form the second curling portion 21.

Since the film layers structure of the display panel 20 are relatively fine, slight scratches will reduce the quality of the panel. When the second curling portion 21 is curled, the first bonding layer 204 and the second bonding layer 205 are curled with the display panel 20 to avoid scratches occurring on the display panel 20, which ensures the stability of the display panel 20.

Figure 4:
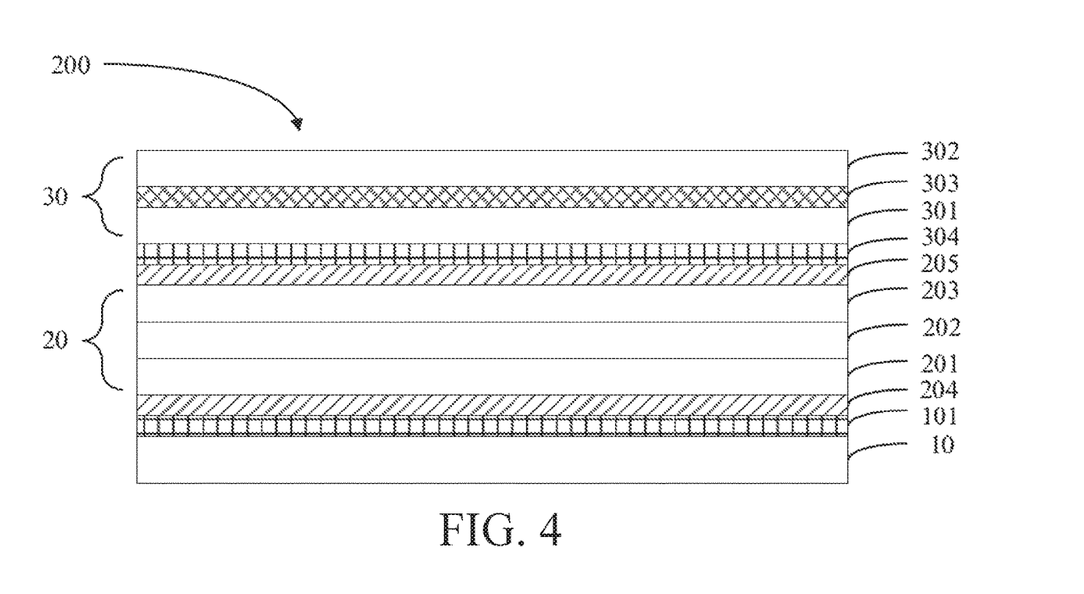
FIG. 4 is a structural diagram of a third type film layer structure of the flexible display screen of the present application.

Please refer to FIG. 4, FIG. 4 is a structural diagram of a third type film layer structure of the flexible display screen of the present application.

The flexible display screen 300 further includes a third bonding layer 101 located between the backplate layer 10 and the first bonding layer 204, and a fourth bonding layer 304 located between the cover-plate layer 30 and the second bonding layer 205.

When the flexible display screen 300 is expanded, the backplate layer 10 is combined with the display panel 20 by the first bonding layer 204 and the third bonding layer 101, and the display panel 20 is combined with the cover-plate layer 30 by the second bonding layer and the fourth bonding layer 304.

When the flexible display screen 300 is curled, the third bonding layer 101 is separated from the first bonding layer 204, the second bonding layer 205 is separated from the fourth bonding layer 304. The backplate layer 10 and the third bonding layer 101 are curled in the clockwise direction or the counterclockwise direction to form the first curling portion 11. The cover-plate layer 30 and the fourth bonding layer 304 are curled in the clockwise direction or the counterclockwise direction, being different from the curling direction of the backplate layer 10 and the third bonding layer 101, to form the third curling portion 31.

The combination of the first bonding layer 204 and the third bonding layer 101, and the combination of the second bonding layer 205 and the fourth bonding layer 304 further ensure the adhesion between the backplate layer 10, the display panel 20, and the cover-plate layer 30.

Please refer to FIG. 2, the flexible display screen 300 further includes a fixed portion 40.

One end of the backplate layer 10, of the display panel 20, and of the cover-plate layer 30 is connected with the fixed portion 40. When the flexible display screen 300 is curled, the backplate layer 10, the display panel 20, and the cover-plate layer 30 are curled from another end away from the fixed portion 40 toward the fixed portion 40.

In the present embodiment, a processor, a driving chip, an external port, and the likes may be disposed in the fixed portion.

In the present embodiment, the fixed portion 40 may be a regular cuboid.

Please refer to FIG. 2 and FIG. 3, the flexible display screen 300 further includes a sliding portion 50.

The sliding portion 50 is disposed in parallel with the fixed portion 40.

In the present embodiment, the sliding portion 50 may be a regular cuboid.

In the present embodiment, the sliding portion 50 is provided with a hollow area. The sliding portion 50 slides between the fixed portion 40 and one end, away from the fixed portion 40, of the flexible display screen 300 through the hollow area.

When the flexible display screen 300 is curled, the sliding portion 50 slides from the end away from the fixed portion 40 toward the fixed portion 40, and the backplate layer 10, the display panel 20, and the cover-plate layer 30 are curled from the end away from the fixed portion 40 toward the fixed portion 40.

Figure 5:
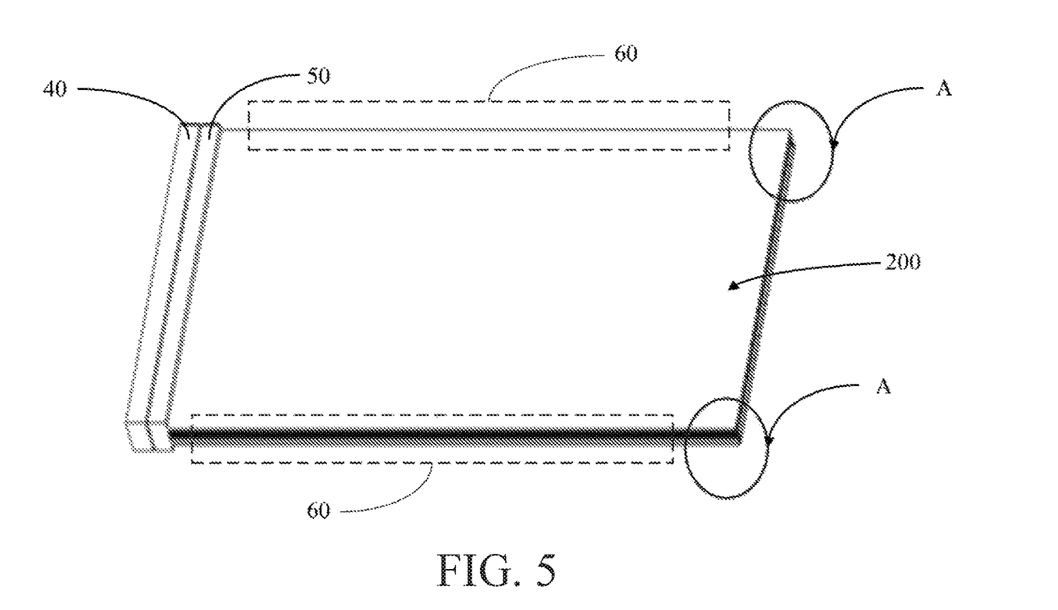
FIG. 5 is a structural diagram showing the flexible display screen of the application in an expanded state.

Please refer to FIG. 5, FIG. 5 is a structural diagram showing the flexible display screen of the application in an expanded state.

When the flexible display screen 300 is expanded, the sliding portion 50 slides from the fixed portion 40 toward the end away from the fixed portion 40, and the first curling portion 11, the second curling portion 21, and the third curling portion 31 are expended to correspondingly form the backplate layer 10, the display panel 20, and the cover-plate layer 30.

Figure 6:
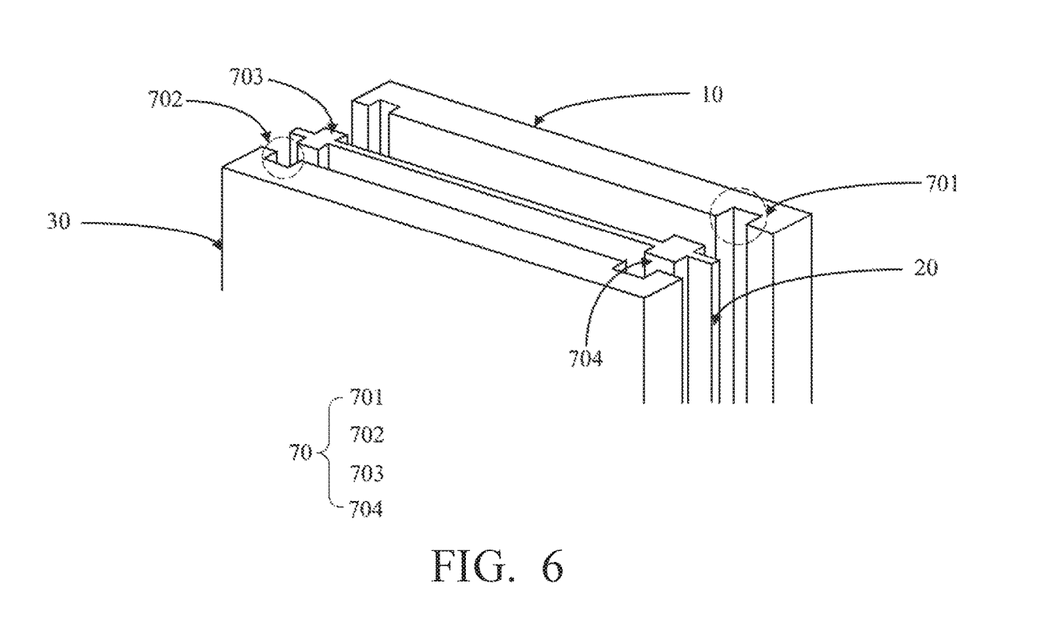
FIG. 6 is an enlarged view of the area A in FIG. 5.

Please refer to FIG. 6, FIG. 6 is an enlarged view of the area A in FIG. 5.

The flexible display screen 300 further includes an engaging area 60.

The engaging area 60 is located at an edge area of the flexible display screen 300.

An engaging assembly 70 is disposed in the engaging area 60.

In the present embodiment, the engaging assembly 70 includes:

at least one first protrusion 701 located at one side, adjacent to the backplate layer 10, of the display panel 20, at least one second protrusion 702 located at one side, adjacent to the cover-plate layer 30, of the display panel 20, at least one first groove 703 located at one side, adjacent to the display panel 20, of the backplate layer 10, and at least one second groove 704 located at one side, adjacent to the display panel 20, of the cover-plate layer 30.

Or at least one first groove located at one side, adjacent to backplate layer, of the display panel, at least one second groove located at one side, adjacent to the cover-plate layer, of the display panel 20, at least one first protrusion located at one side, adjacent to the display panel, of the backplate layer, and at least one second protrusion located at one side, adjacent to the display panel, of the cover-plate layer 30.

Please refer to FIG. 6, the first protrusion 701, the second protrusion 702, the first groove 703, and the second groove 704 may extend from the fixed portion 40 to one end, away from the fixed portion 40, of the flexible display screen 300.

In the present embodiment, the backplate layer 10 may further be provided with two and more of the first groove 703, the cover-plate layer 30 may further be provided with two or more of the second groove 704, and the display panel 20 may further be provided with two or more of the first groove 703 and the second groove 704.

In the present embodiment, in order to perform better coordination for the backplate layer 10, the display panel 20, and the cover-plate layer 30, the number of the first protrusion 701 is equal to the number of the first groove 703, and the number of the second protrusion 702 is equal to the number of the second groove 704.

When the flexible display screen 300 is expanded, the sliding portion 50 slides from the fixed portion 40 toward one end, away from the fixed portion 40, of the flexible display screen 300, the sliding portion 50 realizes the engagement of the first protrusion 701 of the display panel 20 and the first groove 703 of the backplate layer 10, and the engagement of the second protrusion 702 of the display panel 20 and the second groove 704 of the cover-plate layer 30.

When the flexible display screen 300 is curled, the sliding portion 50 slides from the end, away from the fixed portion 40, of the flexible display screen 300 toward the fixed portion 40, the first protrusion 701 of the display panel 20 is separated from the first groove 703 of the backplate layer 10, and the second protrusion 702 of the display panel is separated from the second groove 704 of the cover-plate layer 30.

In the present embodiment, there is a certain pre-tightening force existing between the sliding portion 50, the backplate layer 10, the display panel 20, and the cover-plate layer 30.

When the flexible display screen 300 is expanded, the sliding portion 50 slides toward one end, away from the fixed portion 40, of the flexible display screen 300, the sliding portion 50 coordinates the first protrusion 701 and the first groove 703, and the second protrusion 702 and the second groove 704. The backplate layer 10, the display panel 20, and the cover-plate layer 30 are combined under the pre-tightening force of the sliding portion 50, and a vacuum environment is formed between the backplate layer 10, the display panel 20, and the cover-plate layer 30.

When the flexible display screen 300 is curled, the sliding portion 50 slides toward the fixed portion 40, and the backplate layer 10, the display panel 20, and the cover-plate layer 30 lose the pre-tightening force.

The first protrusion 701 is separated from the first groove 703, the second protrusion 702 is separated from the second groove 704, and the backplate layer 10, the display panel 20, and the cover-plate layer 30 correspondingly form the first curling portion 11, the second curling portion 21, and the third curling portion 31.

Figure 7:
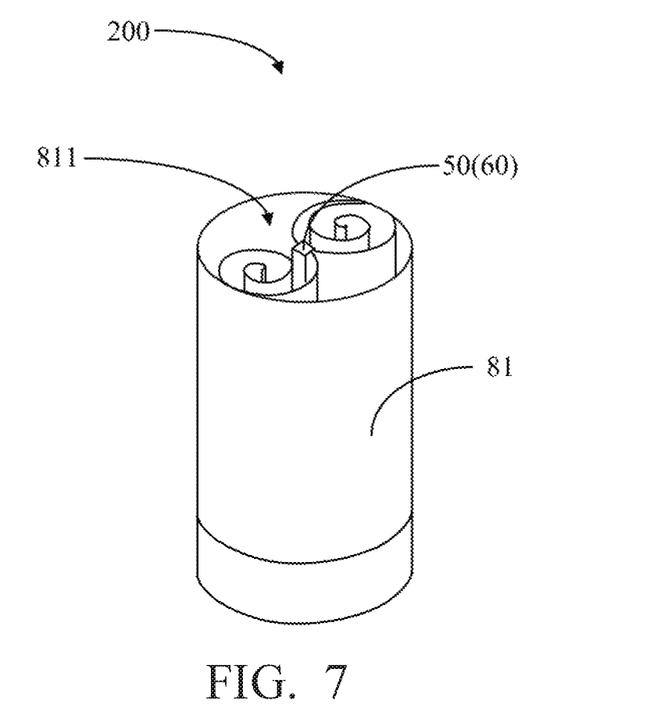
FIG. 7 is a first structural diagram of a flexible display device of the present application.

Please refer to FIG. 7, FIG. 7 is a first structural diagram of a flexible display device of the present application.

The housing assembly 80 includes a first housing 81.

In the present embodiment, the first housing 81 is a hollow housing. The first housing 81 is a rigid housing for protecting the flexible display screen 300.

When the flexible display screen 300 is curled, the first curling portion 11, the second curling portion 21, and the third curling portion 31 may be placed in the first housing 81 to prevent the display panel 20 from being scratched by an external device.

In the present embodiment, a first opening 811 is disposed on the one end of the first housing 81.

When the flexible display screen 300 is curled, the first curling portion 11, the second curling portion 21, and the third curling portion 31 enter the first housing 81 via the first opening 811.

In the present embodiment, an inscribed circle diameter of the first housing 81 is greater than a circumscribed circle diameter of the second curling portion 21, such that the flexible display screen 300 can be placed in the first housing 81.

Figure 8:
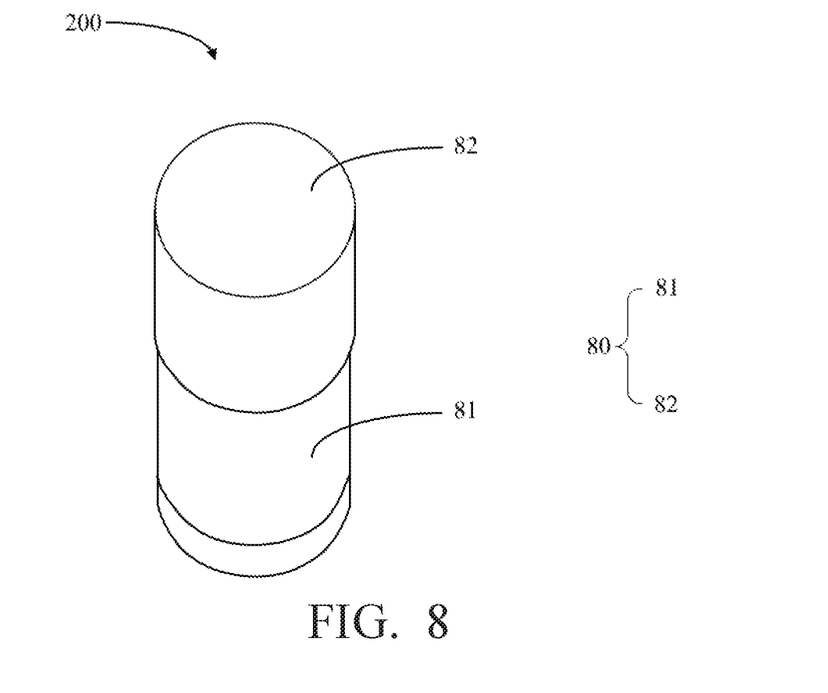
FIG. 8 is a second structural diagram of the flexible display device of the present application.

Please refer to FIG. 8, FIG. 8 is a second structural diagram of the flexible display device of the present application.

The housing assembly 80 further includes a second housing 82.

A second opening (not shown) is disposed on one end of the second housing 82. The first housing 81 enters the second housing 82 via the second opening, such that the flexible display screen 300 can be further protected.

In the present embodiment, a power supply assembly is disposed in the first housing 81 and/or in the second housing 82.

When the flexible display device 100 is in use, the flexible display screen 300 is taken from the housing assembly 80. The first curling portion 11, the second curling portion 21, and the third curling portion 31 are combined by the engaging assembly 70 and the bonding layers through the sliding portion 50, so as to form a flexible display screen 300 in the expanded state. The flexible display screen 300 is connected with the power supply assembly on the housing assembly 80 by an external data line and a corresponding port to drive the displaying pictures of the flexible display screen.

The present application provides a flexible display device, including a housing assembly, and a flexible display screen located in the housing assembly. The flexible display screen includes a backplate layer, a display panel located on the backplate layer, and a cover-plate layer located on the display panel. When the flexible display screen is curled, the backplate layer forms a first curling portion, the display panel forms a second curling portion, and the cover-plate layer forms a third curling portion. The first curling portion and the third curling portion are located inside the second curling portion. The present application curls the flexible display screen by dividing the flexible display screen into three portions, wherein the curling direction of the first curling portion and of the third curling portion are opposite, and the second curling portion can wrap the first curling portion and the third curling portion. The flexible display screen is curled into a cylinder, such that the volume of the flexible display screen can be reduced and the flexible display screen can convenient to carry.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A flexible display device, comprising:
   a housing assembly, and a flexible display screen located in the housing assembly;
   wherein the flexible display screen comprises a backplate layer, a display panel located on the backplate layer, and a cover-plate layer located on the display panel;
   when the flexible display screen is curled, the backplate layer forms a first curling portion, the display panel forms a second curling portion, and the cover-plate layer forms a third curling portion;
   a curling direction of the first curling portion is different from a curling direction of the third curling portion, a curling direction of the second curling portion is same as the curling direction of the first curling portion or of the third curling portion, wherein the first curling portion and the third curling portion are located inside the second curling portion.

2. The flexible display device according to claim 1, wherein a circumscribed circle diameter of the second curling portion is equal to the sum of a circumscribed circle diameter of the first curling portion and a circumscribed circle diameter of the third curling portion.

3. The flexible display device according to claim 2, wherein the circumscribed circle diameter of the first curling portion is equal to the circumscribed circle diameter of the third curling portion.

4. The flexible display device according to claim 1, wherein the backplate layer is curled in the clockwise direction or the counterclockwise direction to form the first curling portion;
   the cover-plate layer is curled in the clockwise direction or the counterclockwise direction, being different from the curling direction of the backplate layer, to form the third curling portion;
   the display panel is curled in the clockwise direction or the counterclockwise direction to form the second curling portion.

5. The flexible display device according to claim 1, wherein the flexible display screen further comprises a first bonding layer located between the backplate layer and the display panel, and a second bonding layer located between the display panel and the cover-plate layer;
   when the flexible display screen is curled, the first bonding layer is separated from the backplate layer, the second bonding layer is separated from the cover-plate layer, and the first bonding layer, the second bonding layer, and the display panel are curled in the clockwise direction or the counterclockwise direction to form the second curling portion.

6. The flexible display device according to claim 5, wherein the flexible display screen further comprises a third bonding layer located between the backplate layer and the first bonding layer, and a fourth bonding layer located between the cover-plate layer and the second bonding layer;
   when the flexible display screen is curled, the third bonding layer is separated from the first bonding layer, the second bonding layer is separated from the fourth bonding layer;
   the backplate layer and the third bonding layer are curled in the clockwise direction or the counterclockwise direction to form the first curling portion;
   the cover-plate layer and the fourth bonding layer are curled in the clockwise direction or the counterclockwise direction, being different from the curling direction of the backplate layer and the third bonding layer, to form the third curling portion.

7. The flexible display device according to claim 1, wherein the flexible display screen further comprises a fixed portion;
   one end of the backplate layer, of the display panel, and of the cover-plate layer connect with the fixed portion;
   when the flexible display screen is curled, the backplate layer, the display panel, and the cover-plate layer are curled from another end away from the fixed portion toward the fixed portion.

8. The flexible display device according to claim 7, wherein a processor, a driving chip, and an external port are disposed in the fixed portion.

9. The flexible display device according to claim 7, wherein the flexible display screen further comprises a sliding portion;

the sliding portion disposed in parallel with the fixed portion;

when the flexible display screen is curled, the sliding portion slides from the end away from the fixed portion toward the fixed portion, and the backplate layer, the display panel, and the cover-plate layer are curled from the end away from the fixed portion toward the fixed portion;

when the flexible display screen is expanded, the sliding portion slides from the fixed portion toward the end away from the fixed portion, and the first curling portion, the second curling portion, and the third curling portion are expended to correspondingly form the backplate layer, the display panel, and the cover-plate layer.

10. The flexible display device according to claim 9, wherein the sliding portion comprises a hollow area;

the sliding portion slides between the fixed portion and one end, away from the fixed portion, of the flexible display screen through the hollow area.

11. The flexible display device according to claim 9, wherein the flexible display screen further comprises an engaging area;

the engaging area is located at an edge area of the flexible display screen;

wherein an engaging assembly is disposed in the engaging area.

12. The flexible display device according to claim 11, wherein the engaging assembly comprises:

at least one first protrusion located at one side, adjacent to the backplate layer, of the display panel, at least one second protrusion located at one side, adjacent to the cover-plate layer, of the display panel, at least one first groove located at one side, adjacent to the display panel, of the backplate layer, and at least one second groove located at one side, adjacent to the display panel, of the cover-plate layer;

when the flexible display screen is expanded, the sliding portion slides from the fixed portion toward one end, away from the fixed portion, of the flexible display screen, the sliding portion realizes the engagement of the first protrusion of the display panel and the first groove of the backplate layer, and the engagement of the second protrusion of the display panel and the second groove of the cover-plate layer;

when the flexible display screen is curled, the sliding portion slides from the end, away from the fixed portion, of the flexible display screen toward the fixed portion, the first protrusion of the display panel is separated from the first groove of the backplate layer, and the second protrusion of the display panel is separated from the second groove of the cover-plate layer.

13. The flexible display device according to claim 1, wherein the flexible display screen further comprises a touch layer;

the touch layer located on the display panel or the cover-plate layer.

14. The flexible display device according to claim 1, wherein the housing assembly further comprises a first housing;

when the flexible display screen is curled, the first curling portion, the second curling portion, and the third curling portion are located in the first housing.

15. The flexible display device according to claim 14, wherein a first opening is disposed on one end of the first housing;

when the flexible display screen is curled, the first curling portion, the second curling portion, and the third curling portion enter the first housing via the first opening.

16. The flexible display device according to claim 14, wherein an inscribed circle diameter of the first housing is greater than a circumscribed circle diameter of the second curling portion.

17. The flexible display device according to claim 14, wherein the housing assembly further comprises a second housing;

a second opening is disposed on one end of the second housing; and the first housing enters the second housing via the second opening.

18. The flexible display device according to claim 17, wherein a power supply assembly is disposed in the first housing or in the second housing.

* * * * *